United States Patent
Sakurada et al.

(10) Patent No.: US 6,190,452 B1
(45) Date of Patent: Feb. 20, 2001

(54) SILICON SINGLE CRYSTAL WAFER AND METHOD FOR PRODUCING IT

(75) Inventors: Masahiro Sakurada; Hideki Yamanaka; Tomohiko Ohta, all of Fukushima-ken (JP)

(73) Assignee: Shin-Etsu Handotai Co., Ltd., Tokyo (JP)

(*) Notice: Under 35 U.S.C. 154(b), the term of this patent shall be extended for 0 days.

(21) Appl. No.: 09/328,278

(22) Filed: Jun. 8, 1999

(30) Foreign Application Priority Data

Jun. 11, 1998 (JP) .................................... 10-179710

(51) Int. Cl.$^7$ .................................... C30B 15/20

(52) U.S. Cl. ................ 117/20; 117/13; 117/30; 117/917

(58) Field of Search .................... 117/13, 20, 30, 117/32, 917

(56) References Cited

U.S. PATENT DOCUMENTS

| | | |
|---|---|---|
| 5,487,354 | 1/1996 | von Ammon et al. . |
| 5,919,302 * | 7/1999 | Falster et al. ............... 117/13 |
| 5,968,262 * | 10/1999 | Saishouji et al. ........... 117/13 |
| 6,027,562 * | 2/2000 | Iida et al. ................... 117/13 |

FOREIGN PATENT DOCUMENTS

| | | |
|---|---|---|
| 4414947 A1 | 8/1995 | (DE) . |
| 0866150 A1 | 9/1998 | (EP) . |
| 0890662 A1 | 1/1999 | (EP) . |
| 4-192345 | 7/1992 | (JP) .............. H01L/21/66 |
| 08330316 | 12/1996 | (JP) .............. H01L/21/322 |
| 8-330316 | 12/1996 | (JP) . |
| WO 92/18672 | 10/1992 | (WO) . |
| WO 98/45507 | 10/1998 | (WO) . |

OTHER PUBLICATIONS

Sadamitsu, et al., "Dependence of the Grown–in Defect Distribution on Growth Rates in Czochralski Silicon," Japanese Journal of Applied Physics, Sep. 1993, vol. 32 No. 9A, pp.3675–3681.

Dupret, et al., "Global Modelling of Heat Transfer in Crystal Growth Furnaces," Int. J. Heat Mass Transfer, vol. 33, No. 9, pp. 1849–1871.

Ammon von W, et al., "The dependence of bulk defects on the axial temperature gradient of silicon crystal during Czochralski growth" Journal of Crystal Growth, vol. 151, No. 3/4, Jun. 1, 1995, pp. 273–277.

* cited by examiner

Primary Examiner—Felisa Hiteshen
(74) Attorney, Agent, or Firm—Hogan & Hartson, LLP

(57) ABSTRACT

There is disclosed a method for producing a silicon single crystal in accordance with the Czochralski method wherein a crystal is pulled with controlling a temperature in a furnace so that $\Delta G$ may be 0 or a negative value, where $\Delta G$ is a difference between the temperature gradient $Gc$ (° C./mm) at the center of a crystal and the temperature gradient $Ge$ (° C./mm) at the circumferential portion of the crystal, namely $\Delta G=(Ge-Gc)$, wherein G is a temperature gradient in the vicinity of a solid-liquid interface of a crystal from the melting point of silicon to 1400° C., and with controlling a pulling rate in a range between a pulling rate corresponding to a minimum value of the inner line of OSF region and a pulling rate corresponding to a minimum value of the outer line, when OSF region is generated in an inverted M belt shape in a defect distribution chart which shows a defect distribution in which the horizontal axis represents a diameter of the crystal and the vertical axis represent a pulling rate. There can be provided a method of producing a silicon single crystal wafer by CZ method wherein OSF in the ring shape distribution generated when being subjected to thermal oxidation or latent nuclei of OSF is present in a low density, and neither FPD, COP, L/D, LSTD nor defect detected by Cu decoration is present under a stable manufacture condition.

16 Claims, 3 Drawing Sheets

CRYSTAL GROWTH DIRECTION

CRYSTAL GROWTH DIRECTION

SILICON SINGLE CRYSTAL WAFER AND METHOD FOR PRODUCING IT

BACKGROUND OF THE INVENTION

1. Field of the Invention

The present invention relates to a silicon single crystal wafer having few crystal defects, as well as to a method for producing it.

2. Description of the Related Art

Along with a decrease in size of semiconductor devices for achieving an increased degree of integration of semiconductor circuits, more severe quality requirements have recently been imposed on silicon single crystals which are grown by the Czochralski method (hereinafter referred to as the CZ method) for use as materials for substrates of semiconductor devices. Particularly, there has been required a reduction in density and size of grown-in defects such as FPDs, LSTDs, and COPs, which are generated during the growth of a single crystal and degrade oxide dielectric breakdown voltage and characteristics of devices.

In connections with the above-mentioned defects incorporated into a silicon single crystal, first are described factors which determine the concentration of a point defect called a vacancy (hereinafter may be referred to as V) and the concentration of a point defect called an interstitial-silicon (hereinafter may be referred to as I).

In a silicon single crystal, a V region refers to a region which contains a relatively large number of vacancies, i.e., depressions, pits, voids or the like caused by missing silicon atoms; and an I region refers to a region which contains a relatively large number of dislocations caused by excess silicon atoms or a relatively large number of clusters of excess silicon atoms. Further, between the V region and the I region there exists a neutral (hereinafter may be referred to as N) region which contains no or few excess or missing silicon atoms. Recent studies have revealed that the above-mentioned grown-in defects such as FPDs, LSTDs, and COPs are generated only when vacancies and/or interstitials are present in a supersaturated state and that even when some atoms deviate from their ideal positions, they do not appear as a defect so long as vacancies and/or interstitials do not exceed the saturation level.

It has been confirmed that the concentration of vacancies and/or interstitials depends on the relation between the pulling rate (growth rate) of crystal in the CZ method and the temperature gradient G in the vicinity of a solid-liquid interface of a growing crystal, and that another type of defect called oxidation-induced stacking fault (hereinafter may be referred to as OSF) is present in ring-shape distribution in the vicinity of a boundary between a V region and an I region, when the cross section vertical to the axis of crystal growth is observed.

When a crystal is pulled through use of a CZ pulling apparatus with a furnace structure (hereinafter occasionaly referred to as hot zone: HZ) having a large temperature gradient G in the vicinity of a solid-liquid interface of the crystal with varying a growing rate from high speed to a low speed along the crystal axis, a defect distribution chart for defects due to crystal growth as shown in FIG. 5 can be obtained.

The defects in the radial cross section can be classified as follows. When the growth rate is relatively high; e.g., about 0.6 mm/min or higher, grown-in defects such as FPDs, LSTDs, and COPs which are believed to be generated due to voids at which vacancy-type points defects aggregate are present at a high density over the entire radial cross section of a crystal. The region where these defects are present is called a "V-rich region" (See FIG. 5(A), line (A) and FIG. 6(A)). When the growth rate is not greater than 0.6 mm/min, as the growth rate decreases the above-described OSF ring is generated from a circumferential portion of the crystal. In such a case, L/D (large dislocation, simplified expression of interstitial dislocation loop) defects such as LSEPDs and LFPDs which are believed to be generated due to dislocation loop are present at a low density outside the OSF ring.

The region where these defects are present is called an "I-rich region" (hereinafter occasionally referred to as L/D region). Further, when the growth rate is decreased to about 0.4 mm/min or less, the above-described OSF ring shrinks to the center of a wafer and disappears, so that the I-rich region spreads over the entire cross section of the wafer (See FIG. 5, line (C), FIG. 6(C)).

Further, there has been recently found the existence of a region, called a N (neutral) region, which is located between the V-rich region and the I-rich region and outside the OSF ring and in which there exists neither defects of FPDs, LSTDs and COPs stemming from voids nor defects of LSEPDs and LFPDs stemming from a dislocation loop. The region has been reported to be located outside the OSF ring, and substantially no oxygen precipitation occurs there when a single crystal is subjected to a heat treatment for oxygen precipitation and the contrast due to oxide precipitates is observed through use of an X-ray beam. Further, the N-region is on an I-rich region side, and is not rich enough to cause formation of LSEPDs and LFPDs (See FIG. 5, line (B), FIG. 6(B)).

It is proposed that the N-region that is present only partly in the wafer when using a conventional CZ pulling apparatus can be expanded by improving temperature distribution in the furnace of the pulling apparatus, controlling a pulling rate so that V/G value may be 0.20–0.22 mm$^2$/° C.·min, in which V is a pulling rate (mm/min), and G is an average intra-crystal temperature gradient (° C./mm) along the pulling direction from a melting point of silicon to 1300° C. (° C./mm) in the entire surface of the wafer and in full length of the crystal (Japanese Patent Application Laid-open (kokai) No. 8-330316).

However, for producing such a single crystal that the region having a very low defect density is expanded to the entire crystal, the producing condition should be controlled in a very narrow range, since the region is limited to the N-region on the side of I-rich region. Particularly, not in a test machine but in a machine for actual production, it is difficult to control precisely, and therefore, there is a problem in productivity, and such a method is not practical.

In a current method of general silicon single crystals, when the growing rate is intentionally changed along the crystal axis from high speed to low speed as shown in FIG. 5, the following types of crystals can be obtained as shown in FIG. 6: (A) crystals having V-rich region in the entire cross section, (B) crystals having both V-rich region and N-region, (C) crystals having I-rich region in the entire cross section (occasionally referred to as L/D rich region type crystal) and (D) crystals having both V-rich region and I-rich region (not shown). Therefore, the growing rate is controlled along the crystal axis to produce a crystal having a quality suitable for intended uses.

The crystals of the type (A) are mass-produced as standard products. The crystal of the type (B), namely V-N coexistent type crystals are produced as improved products of the crystals of the type (A). However, in a device process, yield is low in V-rich region although high in N-region. Accordingly, the crystal of the type (B) is not completely improved. The crystals of the type (C), wherein the entire cross section is occupied by I-rich region are produced as a particle monitor. However, it is not used for fabrication of device, since L/D is detrimental.

The wafers of the types (A), (C) and (D) have a problem that the device yield is lowered by influence of large vacancies, interstitial dislocations or the like remaining on the surface of the wafers when they are used in a device process.

Recently, crystals of type (E) wherein the entire cross section is occupied by N-region (not shown) are proposed. However, they are not practical, since productivity thereof is low. There are also proposed crystals of type (F) wherein the entire cross section is occupied by N-region and OSF ring is generated when being subjected to thermal oxidation or nuclei of OSF ring are present, and neither FPD nor L/D is present in the entire cross section (Japanese Patent Application No. 9-325428). However, there may be present vacancy defects which are finer than FPD. Such defects are detected with Cu decoration. They may cause degradation of oxide dielectric breakdown voltage, and require further improvement.

SUMMARY OF THE INVENTION

The present invention has been accomplished to solve the above-mentioned previous problems, and an object of the invention is to produce under a stable manufacture condition a silicon single crystal wafer by CZ method wherein OSF in the ring shape distribution generated when being subjected to thermal oxidation or latent nuclei of OSF is present in a low density, and neither FPD, COP, L/D, LSTD nor defect detected by Cu decoration is present.

To achieve the above-mentioned object, the present invention provides a silicon single crystal wafer produced by Czochralski method wherein OSF in the ring shape distribution generated when being subjected to thermal oxidation or nuclei of OSF are present, but neither FPD, COP, L/D, LSTD nor defect detected by Cu decoration is present in the entire surface of the wafer.

As described above, in the wafer of the present invention, although OSF in the ring shape distribution or latent nuclei of OSF are present, grown-in defects such as FPD or the like are not present. Particularly, defects detected by Cu decoration are not present in the wafer of the present invention.

Preferably, oxygen concentration in the wafer is less than 24 ppma (ASTM'79 value).

There can be thereby obtained a silicon single crystal wafer wherein OSF is not generated although latent nuclei of OSF are present when being subjected to thermal oxidation, neither FPD, COP, L/D, LSTD nor defect detected by Cu decoration is present in the entire cross section.

The present invention also provides a silicon single crystal wafer containing very few defects having a density of OSF of 100 number/$cm^2$ or less generated when the wafer is subjected to the thermal oxidation treatment. The density of OSF is measured by subjecting a silicon single crystal wafer to a heat treatment at 1200° C. for 100 minutes and then to a etching treatment with Wright solution.

The above mentioned silicon single crystal wafer can be produced by, for example, a method for producing a silicon single crystal in accordance with the CZ method wherein a silicon single crystal is pulled so that ΔG may be 0 or a negative value, where ΔG is a difference between the temperature gradient Gc (° C./mm) at the center of a crystal and the temperature gradient Ge (° C./mm) at the circumferential portion of the crystal, namely ΔG=(Ge−Gc), wherein G is a temperature gradient in the vicinity of a solid-liquid interface of a crystal from the melting point of silicon to 1400° C.

The present invention provides a method for producing a silicon single crystal in accordance with the CZ method wherein a crystal is pulled with controlling a temperature in a furnace so that ΔG may be 0 or a negative value, where ΔG is a difference between the temperature gradient Gc (° C./mm) at the center of a crystal and the temperature gradient Ge (° C./mm) at the circumferential portion of the crystal, namely ΔG=(Ge−Gc), wherein G is a temperature gradient in the vicinity of a solid-liquid interface of a crystal from the melting point of silicon to 1400° C., and with controlling a pulling rate in a range between a pulling rate corresponding to a minimum value of the inner line of OSF region and a pulling rate corresponding to a minimum value of the outer line, when OSF region is generated in an inverted M belt shape in a defect distribution chart which shows a defect distribution in which the horizontal axis represents a diameter of the crystal and the vertical axis represent a pulling rate.

The OSF region means a distribution of OSF ring in a direction of a crystal growing axis.

As described above, when the crystal is pulled with controlling the temperature in the furnace so that the difference ΔG between the temperature gradient at the center of a crystal and the temperature gradient at the circumferential portion of the crystal wherein G is a temperature gradient in the vicinity of a solid-liquid interface of a crystal from the melting point of silicon to 1400° C., may be 0 or negative value, and with controlling a pulling rate to be in the range defined above, using the defect distribution chart of FIG. 1 which is prepared by analyzing results of experiments and investigation, silicon single crystal wherein OSF in the ring shape distribution or latent nuclei of OSF are present when being subjected to thermal oxidation and neither FPD, COP, L/D, LSTD nor defect detected by Cu decoration is present in the entire surface of the wafer can be produced.

In one embodiment of the present invention, the accuracy of the pulling rate during growth of the crystal is in the range of an average of values which are calculated at every tenth centimeters of growth length of the constant diameter portion of the crystal (the straight body part of the single crystal) ±0.01 [mm/min]. Such an accurate pulling rate makes it possible to stably produce a silicon single crystal under the above-mentioned condition.

In order to control the temperature in the furnace, an annular solid-liquid interface insulator is provided in the pulling apparatus such that a gap of 5–10 cm is formed between the lower end of the insulator and the surface of the silicon melt.

The temperature in the furnace is thus controlled so that the difference ΔG between the temperature gradient Gc [° C./cm] at the center of a crystal and the temperature gradient Ge [° C./cm] at the circumferential portion of the crystal [ΔG=(Ge−Gc)] may be 0 or a negative value, namely the temperature gradient at the circumferential portion of the crystal may be the same as, or lower than the temperature gradient at the center of the crystal. The defect distribution is in an inverted M shape in the above case.

In the silicon single crystal wafer produced by slicing the silicon single crystal produced by the above-mentioned methods, OSF genereated in the ring shape distribution or nuclei of OSF are present when being subjected to thermal oxidation, but neither FPD, COP, L/D, LSTD nor defects detected by Cu decoration is present on the entire surface of the wafer.

As described above, according to the present invention, there can be easily produced a silicon single crystal wafer wherein OSF in the ring shape distribution generated when being subjected to thermal oxidation or latent nuclei of OSF are present, and neither FPD, COP, L/D, LSTD nor defect detected by Cu decoration is present in the entire surface of the wafer, namely N-region is expanded to the maximum. Furthermore, the silicon single crystal wafer having no OSF and substantially no defects in the entire surface of the wafer can be produced by lowering oxygen concentration.

Figure 5:
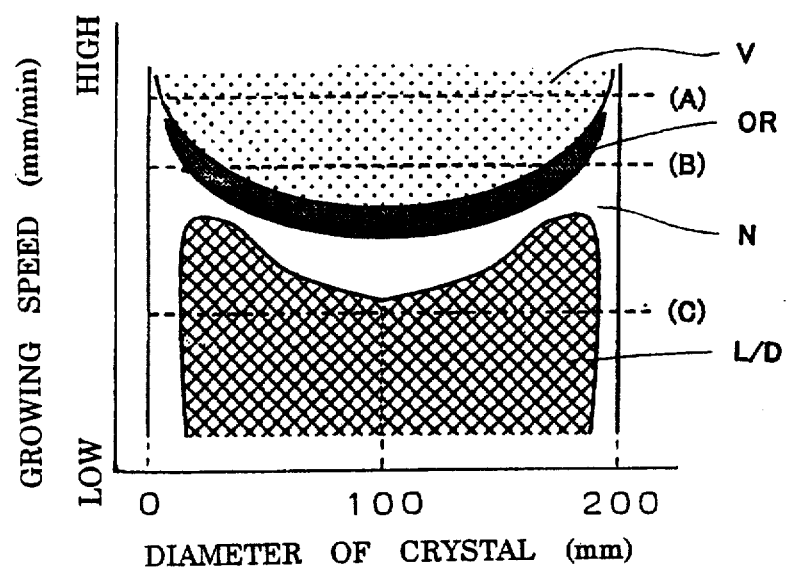
Figures 6A, 6B, 6C:
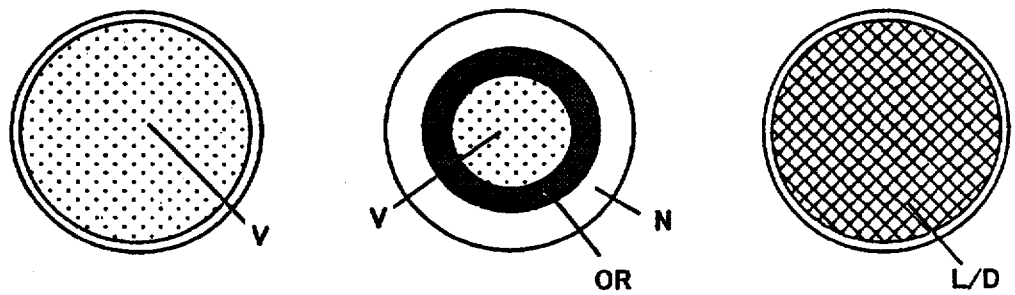

(a) an example using a specific furnace structure;

(b) an example using the same furnace structure as (a) except that further comprises an upper insulating material;

FIG. 5 shows a defect distribution chart in a silicon single crystal pulled by the conventional method wherein the horizontal axis is a position in a radial direction, and the vertical axis is a growing rate; and FIG. 6 is an explanatory view showing a relation between a pulling rate and a defect distribution in the plane of the crystal produced according to the conventional pulling method (A) high speed pulling, (B) medium speed pulling (C) low speed pulling.

DESCRIPTION OF THE INVENTION AND EMOBDIMENT

The present invention will now be described in detail, but the present invention is not limited thereto. First, terms appearing herein will be described.

1) FPD (Flow Pattern Defect) denotes flow patterns which, together with pits, are generated in the surface of a wafer which is sliced from a grown silicon single crystal ingot and treated by the steps of: removing a damaged layer from the surface portion of the wafer through etching with a mixed solution of hydrofluoric acid and nitric acid, and etching the wafer surface with a mixed solution of $K_2Cr_2O_7$, hydrofluoric acid, and water (Secco etching). As FPD density in the wafer surface portion becomes higher, failure rate with regard to dielectric breakdown strength of oxide film increase (Japanese patent Laid-Open (kokai) No, 4-192345).

2) SEPD (Secco Etch Pit Defect) denotes pits which are generated alone in the surface portion of a wafer which is Secco-etched in the same manner as in the case of FPD. Pits accompanied by flow patterns are generically referred to as FPD. Pits not accompanied by flow patterns are generically referred to as SEPD. SEPD having a size of 10 μm or more (LSEPD) conceivably derives from a dislocation cluster. When a dislocation cluster is present in a device, current leaks through the dislocation; consequently, the function of a P-N junction is not effected.

3) LSTD (Laser Scattering Tomography Defect) denotes a defect existing in wafer, and the scattering light due to the defect can be detected in the following manner. That is, a wafer is sliced from a grown silicon single-crystal ingot, and is then treated by the steps of: removing a damaged layer from the surface portion of the wafer through with a mixed solution of hydrofluoric acid and nitric acid; and cleaving the wafer. When infrared light is introduced into the wafer through the cleavage plane, and light exiting from the wafer surface is detected, a scattering light due to the defects existing in a wafer can be detected. A scattering defect detected in this observation has already been reported at a meeting of an academic society or the like and is considered to be an oxide precipitate (Jpn. J. Appl. Phys. vol.32, p.3679 1993). According to recent research, LSTD is reported to be an octahedral void.

4) COP(Crystal Originated Particle) denotes a defect which degrades the dielectric breakdown strength of oxide film at a central portion of a wafer and which is revealed as FPD in the case of treatment through Secco etching, but is revealed as COP in the case of cleaning in SC-1(cleaning by using a mixed aqueous solution of $NH_4OH:H_2O_2:H_2O= 1:1:10$) which serves as a preferential etchant. The pit has a diameter not greater than 1 μm and examined by a light scattering method.

5) L/D (Large Dislocation; simplified expression of interstitial dislocation loop) denotes defects, such as LSEPD and LFPD, which are considered to be generated due to a dislocation loop. As described above, LSEPD refers to SEPD having a size not less than 10 μm, while LFPD refers to FPD whose tip end has a size not less than 10 μm. These are also considered to be generated due to dislocation loops.

6) Cu decoration is a method for observing crystal defects with an infrared microscope after precipitating impurities in the defect by thermally diffusing impurities (Cu) intentionally and rapidly cooling it after saturated. It is effective for detection of finer vacancy defects (V defects: vacancy type point defect).

As described in Japanese Patent Application No. 9-199415, the inventors of the present invention have studied in detail defects generated in the vicinity of a boundary between a V region and an I region of a silicon single crystal grown according to the CZ method and found that in the vicinity of the boundary there exists a very narrow neutral region in which the number of FPDs, LSTDs, and COPs is considerably low, and no L/Ds exist.

Based on the above-described finding, the present inventors conceived that if N-region can be expanded to the entire cross section of a wafer, the number of point defects can be greatly decreased. That is, when the growth (pulling) rate of a single crystal and the temperature gradient therein are considered, the main factor that determines the distribution of point defects within the cross section is the temperature gradient, because the pulling rate is substantially constant throughout the cross section of the crystal. That is, the present inventors found that one problem is variation in the temperature gradient in the axial direction among different points within a cross section of the crystal and also found that if such variation can be decreased, the variation in the point defect density across the cross section can be decreased. Thus, the inventors of the present invention succeeded in obtaining a defect-free wafer whose entire surface is occupied by an N-region, through control of the intra-furnace temperature such that the difference ΔG between the temperature gradient Gc at the center of a crystal and the temperature gradient Ge at the circumferential portion of the crystal become 5° C./cm or less [ΔG= (Ge−Gc)≦5° C./cm] and adjustment of the pulling rate.

The inventors of the present invention have studied the cross section of the crystal by growing a crystal through use of a crystal pulling apparatus by CZ method wherein a difference of temperature gradient ΔG is small as described above, with varying ΔG by changing a furnace structure, and varying a pulling rate. As a result, the following findings can be obtained.

Figure 4A:
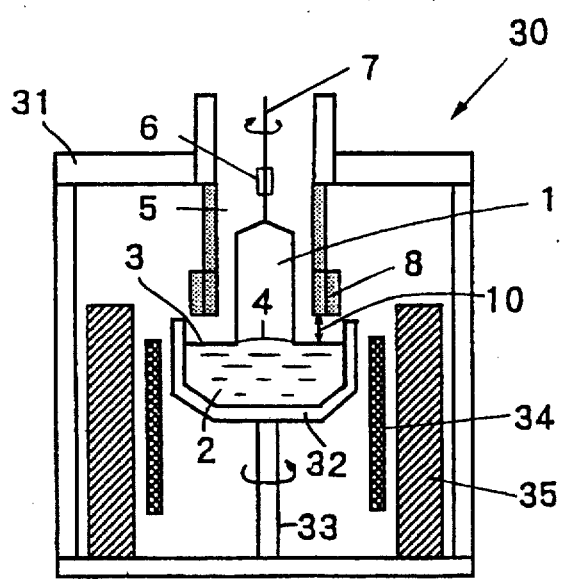
FIG. 4 is a schematic view showing the apparatus for pulling a single crystal used in the present invention.

The furnace structure shown in FIG. 4(a) was used to grow a crystal with varying ΔG by changing a distance from a surface of a melt to a lower end of an annular solid-liquid interface insulator, and with varying an average pulling rate in the range of 0.6 to 0.3 mm/min at an interval of 10 cm so as to be decreased by 0.05 mm/min, and studied a way that OSF ring is eliminated at a center of a bulk of crystal and L/D region is formed.

Figure 1:
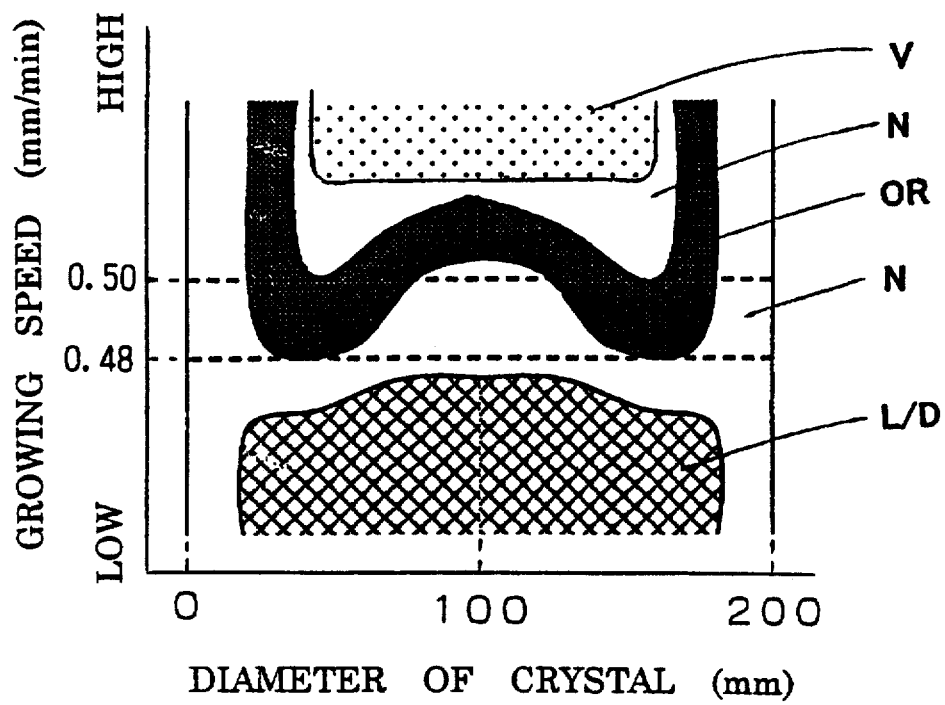
FIG. 1 shows a defect distribution chart in a silicon single crystal of the present invention in an axial direction wherein the horizontal axis is a position in a radial direction, and the vertical axis is a growing rate.

The result was analyzed and shown in a defect distribution chart of FIG. 1. The horizontal axis is a position in a radial direction of the crystal, and the vertical axis is a growing rate.

Figure 3:
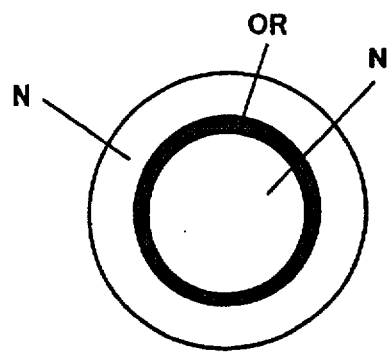
FIG. 3 is an explanatory view showing radial defect distribution in the crystal when the crystal was pulled under the condition defined in the present invention.

As shown in FIG. 1, OSF is generated in a inverted M belt shape, when ΔG is 0 or a negative value, namely the temperature gradient Ge (° C./mm) at the circumferential portion of the crystal is the same as, or lower than the temperature gradient Gc (° C./mm) at the center of a crystal, and a growing rate is in the range of 0.52 to 0.48 mm/min. Furthermore, when the cross section of the crystal was observed when the growing rate is 0.50 to 0.48 mm/min, and it is found that OSF ring or latent nuclei thereof are present as shown in FIG. 3, but other part is occupied by N-region in the wafer.

The most significant feature of the wafer is that N-region other than OSF region is N-region on I-rich side. Namely, the inside of the OSF ring is generally to be V-rich (See FIG. 5, line (B), FIG. 6(B)). Nevertheless, according to the present invention, both of the inside and the outside of the OSF ring are N-region on I-rich side. Accordingly, FPD, COP, and defects to be detected by Cu decoration are not present on the entire surface of the wafer.

Figure 2:
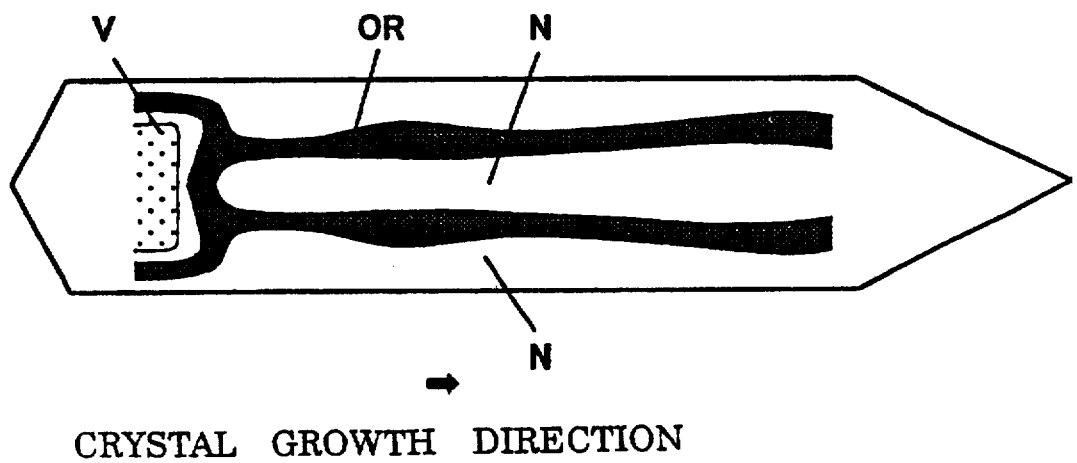
FIG. 2 is a explanatory vertical section view showing a defect distribution in an axial direction of a single crystal ingot produced by the present invention.

According to the present invention, a crystal is pulled with controlling a pulling rate in the range between the pulling rate corresponding to the minimum value of the inner line of the OSF region and the minimum value of the outer line of the OSF region, when OSF region is generated in an inverted M belt shape in the defect distribution chart of FIG. 1. More specifically, the crystal is pulled at a growing rate in the range of 0.50 to 0.48 mm/min with controlling in high accuracy to be in the range of average value of the intended growing rate calculated at every 10 cm of length in a growing direction at a constant diameter portion of the crystal ±0.01 mm/min. The single crystal ingot thus obtained was cut vertically, and defect distribution was determined in the same manner as above. The result is shown in FIG. 2. It is apparent as shown in FIG. 2 that OSF region is distributed in a ring shape, and the entire cross section other than OSF region is occupied by N-region in the portion pulled with maintaining an optimal growing rate.

On the contrary, when ΔG is a plus value, namely, the temperature gradient Ge (° C./mm) at the circumferential portion of the crystal is higher than the temperature gradient Gc (° C./mm) at the center of the crystal, and a growing rate is in the range of about 0.6 to 0.4 mm/min, OSF is distributed in the U belt shape as shown in FIG. 5, and there is never appeared the wafer such as that of the present invention where N-region on I-rich side formed in the entire cross section and OSF ring or latent nuclei are present.

The above phenomenon has not been found in the case that a conventional crystal pulling apparatus wherein ΔG is plus is used, but has found only by studying the crystal grown through use of a crystal pulling apparatus wherein ΔG is 0 or a negative value mentioned above.

The temperature distribution in the furnace of the pulling apparatus used for the above study was determined by studying thoroughly using a total heat transmission analysis software FEMAG (F. Dupret, P. Nicodeme, Y. Ryckmans, P.Wouters, and M. J. Crochet, Int. J. Heat Mass Transfer, 33, 1849 (1990)).

On the other hand, recent studies revealed that OSF is not generated in the case that oxygen concentration is low in the entire surface of the wafer, even when latent nuclei of OSF are present, and does not affect the device.

The critical range of the oxygen concentration has been studied by pulling crystals using the same crystal pulling apparatus at a several steps of oxygen concentration, and revealed that when oxygen concentration is less than 24 ppma (ASTM'79), OSF is not generated when the wafer is subjected to the thermal oxidation treatment.

Namely, when a crystal is pulled with gradually decreasing oxygen concentration, nuclei of OSF are present in full length of the crystal. However, OSF is generated by thermal oxidation only when nuclei is present at 24 ppma or more. OSF is not generated by thermal oxidation when the nuclei are present in an amount less than 24 ppma of oxygen concentration.

Control of oxygen concentration in growing crystal to be less than 24 ppma can be easily performed by conventional methods, for example, the number of rotation of a crucible and control of convection of a melt by controlling temperature distribution in the melt or the like.

Even when OSF ring is not generated, the amount of oxygen precipitation tends to decrease in the part where nuclei of OSF are present. However, since device process is performed at lower temperature in recent years, high gettering effect is not required and therefore low oxygen precipitation due to OSF ring may not be a problem.

The present invention and embodiments of the present invention will be described below with referring drawings.

An example of constitution of an apparatus for pulling a single crystal used in the present invention is shown in FIG. 4(a). As shown in FIG. 4(a), the apparatus 30 for pulling crystal includes a pulling chamber 31, a crucible 32 provided in the pulling chamber 31, a heater 34 disposed around the crucible 32, a crucible-holding shaft 33 for rotating the crucible 32 and a rotation mechanism (not shown) therefor, a seed chuck 6 for holding a silicon seed crystal 5, a wire 7 for pulling the seed chuck 6, and a winding mechanism (not shown) for rotating and winding up the wire 7. The crucible 32 includes an inner quartz crucible for containing a silicon melt 2 and an outer graphite crucible located outside the quartz crucible. A heat insulating material 35 is disposed around the heater 34.

In order to establish operating conditions for the production method of the present invention, an annular solid-liquid interface insulator 8 is arranged around the solid-liquid interface 4 of a single crystal. The solid-liquid interface insulator 8 is disposed such that a gap 10 of 5–10 cm is formed between the lower end of the insulator 8 and the surface 3 of the silicon melt 2. The upper insulator 9 on the insulating material 35 surrounding the heater shown in FIG. 4(b) may be used depending on the condition of temperature in the furnace. In that case, the gap 10 is controlled. Furthermore, there may be provided a tubular cooling device (not shown) for cooling the single crystal by jetting a cooling gas or by shutting off radiant heat.

Recently, a so-called MCZ method has often been employed. When the MCZ is employed, an unillustrated magnet is disposed outside the pulling chamber 31 in a horizontal orientation so as to apply a magnetic field to the silicon melt 2 in a horizontal or vertical direction or in a like direction. Through the application of magnetic field to the silicon melt 2, convection of the melt 2 is suppressed to thereby stably grow a single crystal.

Next will be described a method for growing a single crystal of the present invention through use of the crystal pulling apparatus 30 mentioned above.

First, a high-purity polycrystalline material of silicon is heated to its melting point (approximately 1420° C.) or higher and is thus melted in the crucible 32. Then, the wire 7 is released until a tip end of the seed crystal comes into contact with the surface of the melt 2 at an approximately central portion or is immersed therein. Subsequently, the crucible holding shaft 33 is rotated in an appropriate direction, and the wire 7 is wound up with being rotated at the same time to pull the seed crystal 5, and thereby growth of the crystal is initiated. Then, through adequate regulation of the pulling rate and temperature, a substantially cylindrical single crystal ingot 1 can be obtained.

Figure 4B:
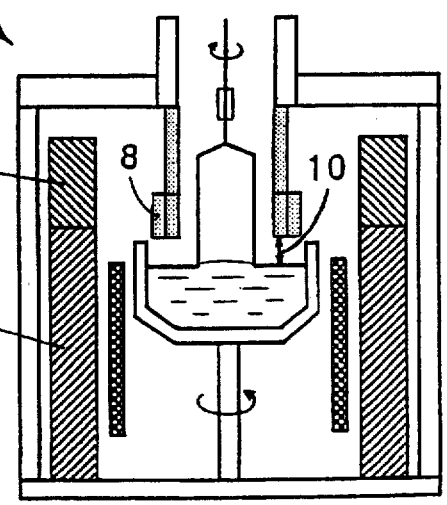

To achieve the objects of the present invention, the invention employs the following structural features. As shown in FIG. 4(a) or FIG. 4(b), the annular solid-liquid interface insulator 8 surrounding the liquid portion of the single crystal ingot 1 above the surface of the melt in the pulling chamber 31 is disposed, and the upper insulator 9 is disposed on the insulating material 35, so that the temperature zone of a melting point of crystal to 1400° C. in the vicinity of the surface of the melt can be controlled.

Namely, the temperature in the furnace can be controlled by providing an annular solid-liquid interface insulator 8 is provided in the pulling chamber 31 such that a gap 10 of 5–10 cm is formed between the lower end thereof and the surface of the silicon melt. Thereby, the temperature in the furnace can be controlled so that the difference $\Delta G$ between the temperature gradient Gc [° C./cm] at the center of a crystal and the temperature gradient Ge [° C./cm] at the circumferential portion of the crystal [$\Delta G=(Ge-Gc)$] may be 0 or a negative value, namely the temperature gradient Ge (° C./mm) at the circumferential portion of the crystal may be the same as, or lower than the temperature gradient Gc (° C./mm) at the center of a crystal.

Alternatively, the gap 10 is controlled, and heat radiation from the upper area is also controlled by providing the insulator 9 on the insulating material 35 as shown in FIG. 4(b).

The accuracy of the pulling rate during above-mentioned growth of the crystal is preferably in the range of an average value which is calculated at every tenth centimeters of length of growth of the constant diameter portion of the crystal ±0.01 [mm/min]. When the accuracy of the pulling rate is in that range, the silicon single crystal wherein nuclei of OSF in the region are present in full length of the crystal but other part of the entire cross section than the part is occupied by N-region can be stably produced, as a result of synergetic affect of the temperature in the furnace ($\Delta G$) and the condition of the pulling rate.

In the silicon single crystal wafer obtained by slicing the silicon single crystal produced by the above-mentioned method, OSF generated in the ring shape distribution when being subjected to the thermal oxidation treatment or nuclei of OSF are present, but neither FPD, COP, L/D, LSTD nor defects detected by Cu decoration is present in the entire surface of the wafer, and defects are very few as density of OSF of 100 numbers/cm$^2$ or less generated by the thermal oxidation treatment.

EXAMPLE

The following examples are being submitted to further explain specific embodiment of the present invention. These examples are not intended to limit the scope of the present invention.

Example 1

A silicon single crystal was grown through use of the crystal pulling apparatus 30 of FIG. 4(a). 100 kg of Polycrystalline material of silicon was charged into a quartz crucible having a diameter of 24 inches. A single crystal ingot having a diameter of 8 inches and a length in the straight body of about one meter and orientation <100> was pulled.

The furnace structure (hot zone: HZ) wherein a gap 10 between the surface 3 of the silicon melt and the lower end of the annular solid-liquid interface insulator 8 was 70 mm was used. The temperature of the silicon melt 2 was kept at about 1420° C.

The average pulling rate was decreased under the following condition, from 0.6 to 0.3 mm/min, by 0.05 mm/min every tenth centimeter, and elimination of OSF ring at the center of a bulk of crystal and formation of L/D region were studied. The crystal was cut vertically at a thickness of 2 mm, and subjected to an etching treatment in order to eliminate a surface mechanical damage to prepare two samples. One of them was subjected to Secco etching for 30 minutes, and FPD and L/D thereon were observed. The other of them was subjected to the heat treatment at 1200° C. for 100 minutes, and then to etching treatment with Wright solution to confirm generation of OSF. The results were summarized in the defect distribution chart of FIG. 1. The horizontal axis is a position in a radial direction, and the vertical axis is a pulling rate. As shown in FIG. 1, OSF was distributed in an inverted M belt shape, which shows that the pulling rate should be controlled to be in the range of 0.48 to 0.50 mm/min in order to produce the silicon single crystal of the present invention with the furnace structure.

According to the results of the above mentioned investigation and experiments, in order to expand in direction of the crystal axis the crystal of the present invention wherein OSF ring is present in the crystal plane, but the entire cross section other than OSF region is occupied by N-region, the crystal was pulled at an optimal growing rate (0.5 to 0.48 mm/min), and to be in the range of an average value which is calculated at every tenth centimeters of length of growth of the constant diameter portion of the crystal ±0.01 [mm/min]. The crystal ingot thus obtained was cut vertically, and the defect distribution thereof was determined in the manner described above. The results were shown in FIG. 2. As shown in FIG. 2, in the part pulled with keeping a growing rate optimally, OSF region was distributed in a ring shape in full length of the crystal, other part of the entire cross section of the crystal than OSF region was occupied by N-region.

Another single crystal ingot was pulled under the same condition as described above, and processed to produce a mirror polished wafer. FPD, L/D, OSF, LSTD or the like therein were evaluated. As shown in FIG. 3, OSF ring was present in the center part of the wafer, other part of the entire cross section than the OSF region was occupied by N-region. The density of the OSF in the OSF region was low as about 50 number/cm². No vacancy type defect in the N-region was detected by Cu decoration.

Then, oxide dielectric breakdown voltage characteristics of the wafer was evaluated, and found to be C mode good chip yield of 100%.

The condition for measurement of C-mode was as follows:

1) thickness of oxide film: 25 nm, 2) measurement electrodes: phosphorous-doped polysilicon, 3) area of the electrodes: 8 mm², 4) current density in decision: 1 mA/cm², and 5) criterion for good chip: a chip (electrode) that did not cause dielectric breakdown in an electric field less than 8 MV/cm was judged to be a good chip.

Example 2

The crystal was pulled in the same manner as Example 1 except that the furnace structure wherein the upper insulator 9 was disposed on the insulating material 35 was provided as shown in FIG. 4(b), and a gap 10 between the surface 3 of the silicon melt and the lower end of the annular solid-liquid interface insulator 8 was 60 mm. The single crystal ingot having almost the same quality as Example 1 was obtained. In that case, the OSF region was apt to be narrower in the surface of the wafer, since $\Delta G$ was shifted further to minus side.

Example 3

The crystal was pulled in the same manner as Example 1 except that oxygen concentration in the growing crystal was controlled to be 24 ppma or less. The defects were evaluated. OSF was not generated when thermal oxidation was performed. It is considered that latent nuclei were present, but OSF was not generated when thermal oxidation was performed, since oxygen concentration was low.

The present invention is not limited to the above-described embodiment. The above-described embodiment is a mere example, and those having the substantially same structure as that described in the appended claims and providing the similar action and effects are included in the scope of the present invention.

For example, in the above-described embodiment, the silicon single crystal having a diameter of 8 inches was grown. However, the present invention can be applied to a method of pulling a crystal recently produced having larger diameter, for example, 10 to 16 inches, or more. Furthermore, the present invention can also be applied to a method in which a horizontal magnetic field, a vertical magnetic field or a cusp magnetic field is applied to silicon melts, so-called MCZ method.

What is claimed is:

1. A method for producing a silicon single crystal in accordance with the Czochralski method wherein a silicon single crystal is pulled so that $\Delta G$ may be 0 or a negative value, where $\Delta G$ is a difference between the temperature gradient Gc (° C./mm) at the center of a crystal and the temperature gradient Ge (° C./mm) at the circumferential portion of the crystal, namely $\Delta G=(Ge-Gc)$, wherein G (changed temperature/length in direction of crystal axis) (° C./mm) is a temperature gradient in the vicinity of a solid-liquid interface of a crystal from the melting point of silicon to 1400° C.

2. The method for producing a silicon single crystal according to claim 1 wherein the accuracy of the pulling rate during growth of the crystal is in the range of an average of values which are calculated at every tenth centimeters of growth length of the constant diameter portion of the crystal (the straight body part of the single crystal) ±0.01 [mm/min].

3. The method for producing a silicon single crystal according to claim 2 wherein an annular solid-liquid interface insulator is provided in the pulling apparatus such that a gap of 5–10 cm is formed between the lower end of the insulator and the surface of the silicon melt in order to control the temperature in the furnace.

4. A silicon single crystal wafer obtained from a silicon single crystal produced by the method according to claim 3.

5. A silicon single crystal wafer obtained from a silicon single crystal produced by the method according to claim 2.

6. The method for producing a silicon single crystal according to claim 1 wherein an annular solid-liquid interface insulator is provided in the pulling apparatus such that a gap of 5–10 cm is formed between the lower end of the insulator and the surface of the silicon melt in order to control the temperature in the furnace.

7. A silicon single crystal wafer obtained from a silicon single crystal produced by the method according to claim 6.

8. A silicon single crystal wafer obtained from a silicon single crystal produced by the method according to claim 1.

9. A method for producing a silicon single crystal in accordance with the Czochralski method wherein a crystal is pulled with controlling a temperature in a furnace so that $\Delta G$ may be 0 or a negative value, where $\Delta G$ is a difference between the temperature gradient Gc (° C./mm) at the center of a crystal and the temperature gradient Ge (° C./mm) at the circumferential portion of the crystal, namely $\Delta G=(Ge-Gc)$, wherein G is a temperature gradient in the vicinity of a solid-liquid interface of a crystal from the melting point of silicon to 1400° C., and with controlling a pulling rate in a range between a pulling rate corresponding to a minimum value of the inner line of OSF region and a pulling rate corresponding to a minimum value of the outer line, when OSF region is generated in an inverted M belt shape in a defect distribution chart which shows a defect distribution in which the horizontal axis represents a diameter of the crystal and the vertical axis represent a pulling rate.

10. The method for producing a silicon single crystal according to claim 9 wherein the accuracy of the pulling rate during growth of the crystal is in the range of an average of values which are calculated at every tenth centimeters of growth length of the constant diameter portion of the crystal (the straight body part of the single crystal) ±0.01 [mm/min].

11. The method for producing a silicon single crystal according to claim 10 wherein an annular solid-liquid interface insulator is provided in the pulling apparatus such that a gap of 5–10 cm is formed between the lower end of the insulator and the surface of the silicon melt in order to control the temperature in the furnace.

12. A silicon single crystal wafer obtained from a silicon single crystal produced by the method according to claim 11.

13. A silicon single crystal wafer obtained from a silicon single crystal produced by the method according to claim 10.

14. The method for producing a silicon single crystal according to claim 9 wherein an annular solid-liquid interface insulator is provided in the pulling apparatus such that a gap of 5–10 cm is formed between the lower end of the insulator and the surface of the silicon melt in order to control the temperature in the furnace.

15. A silicon single crystal wafer obtained from a silicon single crystal produced by the method according to claim 14.

16. A silicon single crystal wafer obtained from a silicon single crystal produced by the method according to claim 9.

* * * * *